(12) United States Patent
Snelten

(10) Patent No.: US 6,426,624 B1
(45) Date of Patent: Jul. 30, 2002

(54) ASSEMBLY FORMED BY A MAGNETIC RESONANCE APPARATUS AND A COMBINATION OF COILS

(75) Inventor: Jeroen Snelten, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/684,302

(22) Filed: Oct. 6, 2000

(30) Foreign Application Priority Data

Oct. 11, 1999 (EP) .......................................... 99203333

(51) Int. Cl.⁷ ................................................ G01V 3/00
(52) U.S. Cl. ........................ 324/318; 324/322; 324/309
(58) Field of Search ................................ 324/318, 322, 324/314, 309, 307, 300

(56) References Cited

U.S. PATENT DOCUMENTS

| | | | |
|---|---|---|---|
| 5,329,233 A | 7/1994 | Hayes | 324/318 |
| 5,664,568 A | 9/1997 | Srinivasan et al. | 128/653.2 |
| 5,677,629 A | * 10/1997 | Borsboom | 324/318 |
| 5,917,324 A | 6/1999 | Leussler | 324/318 |
| 6,060,883 A | * 5/2000 | Knuttel | 324/318 |

FOREIGN PATENT DOCUMENTS

DE 19732783 C 3/1999 .......... G01R/33/34

* cited by examiner

Primary Examiner—Hezron Williams
Assistant Examiner—Brij B. Shrivastav
(74) Attorney, Agent, or Firm—John Vodopia

(57) ABSTRACT

MRI apparatus with a magnet assembly for generating a uniform magnetic field in a measuring volume, wherein a combination of at least two magnetic coils is arranged adjacent an object to be examined in order to detect the radio frequency radiation emanating from the object. The combination may include, for example one birdcage coil (40) and one surface coil (45). The coils are arranged relative to one another and to the magnetic field in such a manner that their areas of sensitivity overlap and that their longitudinal conductors (42 and 47, respectively) extend parallel to the uniform magnetic field $B_0$ and one in the prolongation of the other. It is demonstrated that the difference between the signal-to-noise ratios of the coils causes image degradation due to the disruption (51) of the sensitivity of the coil assembly in the zone between the coils. According to the invention, the end of the longitudinal conductor (49) of the coil having the highest signal-to-noise ratio (45) is bent away from its original plane, in the direction away from the object to be examined, in order to reduce the sensitivity disruption (51) of the coil assembly.

11 Claims, 4 Drawing Sheets

ASSEMBLY FORMED BY A MAGNETIC RESONANCE APPARATUS AND A COMBINATION OF COILS

BACKGROUND OF THE INVENTION

The invention relates to an assembly which is formed by a magnetic resonance apparatus, provided with a magnet system for producing a uniform magnetic field in a measuring volume, and a combination of coils for imaging an object to be examined which is to be arranged in the measuring volume, wherein an orthogonal system of co-ordinates (x, y, z) is chosen in such a manner that its z direction extends parallel to the direction of the magnetic field, the combination of coils includes a first coil and a second coil for the detection of a radio frequency signal emitted by the object, said coils having a first and a second region of sensitivity, respectively, the first and the second coil include a respective longitudinal conductor, which longitudinal conductors extend parallel to a first plane (x-z) defined by the system of co-ordinates whereas their projections on a second plane (y-z) which is orthogonal to the first plane extend substantially parallel to the z direction, the first and the second coil are oriented in space in such a manner that their longitudinal conductors are situated substantially one in the prolongation of the other and that the first region of sensitivity and the second region of sensitivity partly overlap.

SUMMARY OF THE INVENTION

An assembly of this kind is known from U.S. Pat. No. 5,664,568. The known magnetic resonance apparatus constitutes a device for the imaging of an object present in an imaging volume which is further defined as measuring volume. The magnetic resonance apparatus includes a magnet system which is necessary to produce a uniform main magnetic field B0 in a longitudinal direction (z direction) in the measuring volume. The magnetic resonance apparatus is provided with a detection means which are situated in the vicinity of the measuring volume in order to detect a radio frequency signal emitted by the object. In some cases use is made of two specific detection coils which are introduced into the magnetic resonance apparatus. For example, a birdcage coil is used for the imaging of the head whereas a surface coil can be used to image the spinal column. In some cases, for example for the acquisition images of the head together with the cervical vertibrae, however, it is desirable to arrange the two types of coils one in the prolongation of the other, so that the two imaging volumes partly overlap. The birdcage coil is provided with two electrically conductive loops which are interconnected by means of longitudinal electrical conductors. The signal-to-noise ratio of this coil is substantially constant within the volume of the coil and decreases strongly as soon as the edge zones are reached. The surface coil is shaped as a flat mat, the electrical conductors being arranged so as to achieve optimum sensitivity for the detection of the radio frequency signals emanating from the surface of the object. The electrical conductors of the surface coil are formed as turns, the individual signal-to-noise ratios in the turns being constant and equal whereas the signal-to-noise ratio decreases in the edge zones of the surface coil.

To those skilled in the art it will be generally known that when two coils are arranged in the vicinity of one another, a sensitivity disruption will occur in the transitional zone between the coils, thus leading to an unacceptably poor quality of the MR image of the relevant zone. This phenomenon occurs notably in the direct vicinity of the end portions of the longitudinal conductors of the coils.

The cited United States patent does not deal with the problem imposed by the sensitivity disruption so that it does not offer a solution to this problem either.

It is an object of the invention to reduce the sensitivity disruption in the transitional zone between two coils. This object is achieved by means of the assembly according to the invention which is characterized in that the first coil and the second coil have a first and a second signal-to-noise ratio, respectively, the first signal-to-noise ratio being higher than the second signal-to-noise ratio, and that at least one end portion of the longitudinal conductor of the first coil which faces the second coil is situated outside the y-z plane and extends in the direction away from the measuring volume. This solution is not coil-specific and can be used for all coil combinations exhibiting a difference in respect of signal-to-noise ratio.

It has been found that when the end portion of the longitudinal conductor of the coil having the highest signal-to-noise ratio is bent away from the y-z plane, the sensitivity of the relevant coil is varied so that the magnitude of the sensitivity disruption in the transitional zone can be influenced. It is to be understood that the necessary variation of the sensitivity of the first coil can be realized in various ways, that is, by selecting different ways of orienting the entire longitudinal conductor, or an end portion thereof, relative to the y-z plane. It has been found that this simple intervention significantly enhances the quality of the MR image. This solution does not require additional peripheral equipment and can be readily implemented.

It has been found that the sensitivity disruption can also occur around the end portions of the coils in the transitional zone between a coil and an environment. In conformity with the foregoing reasoning, the sensitivity disruption can be reduced by bending away the coils in the vicinity of the transitional area. This is achieved by means of an embodiment of the assembly according to the invention which is characterized in that the end portion of the longitudinal conductor of the first coil which is remote from the second coil is also bent away from the y-z plane. This step can also be taken for the second coil.

It has also been found in practice that the tuning of the coil must be constant as a function of time in order to sustain the required variation of the signal-to-noise ratio in the transitional zone. This is achieved by means of the assembly according to the invention wherein an end portion of the first coil and/or the second coil is arranged at least partly in a preformed, form-retaining fixture.

BRIEF DESCRIPTION OF THE DRAWINGS

These and other aspects of the invention will be described in detail hereinafter with reference to the Figures. Therein.

DESCRIPTION OF THE PREFERRED EMBODIMENTS

Figure 1:
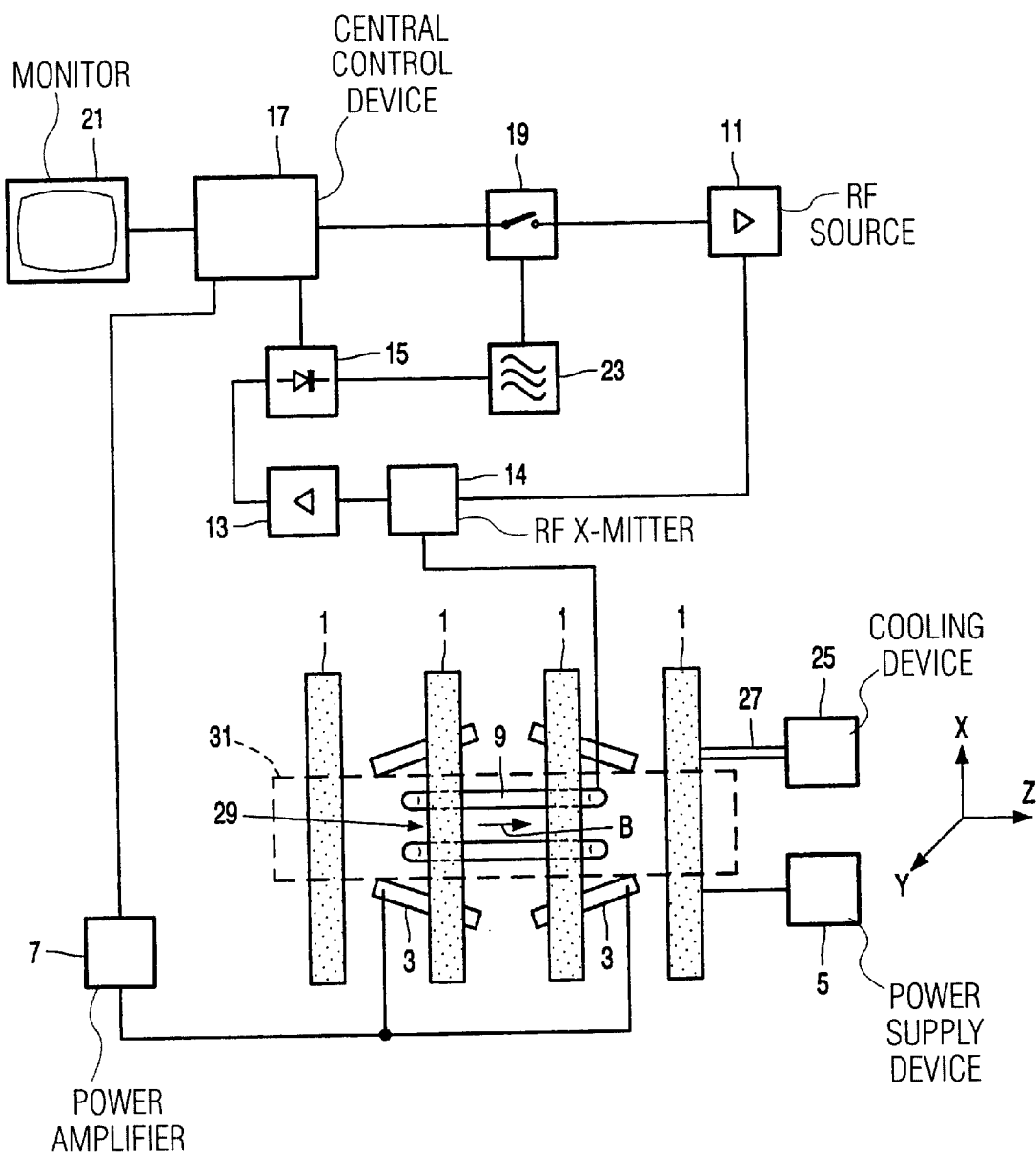
FIG. 1 shows diagrammatically a general construction of a magnetic resonance apparatus.

The magnetic resonance apparatus which is diagrammatically shown in FIG. 1 includes a first magnet system 1 for generating a uniform magnetic field B, a second magnet system 3 (the gradient coil system) for generating magnetic gradient fields, a power amplifier 7 for the gradient coil system 3, and a power supply device 5 for the first magnet system 1. A radio frequency (RF) coil 9 serves to generate a radio frequency magnetic alternating field; to this end it is connected to an RF transmitter device which includes a radio frequency source 11. The RF coil 9 can also be used for the detection of spin resonance signals generated by the radio frequency transmission field in an object to be examined (not shown); to this end, this coil is connected to, an RF receiver device which includes a signal amplifier 13. The output of the signal amplifier 13 is connected to a detector circuit 15 which is connected to a central control device 17. The central control device 17 also controls a modulator 19 for the RF source 11, the power amplifier 7 and a monitor 21 for display. A radio frequency oscillator 23 controls the modulator 19 as well as the detector 15 which processes the measuring signals. A cooling device 25 with cooling ducts 27 serves to cool the magnet coils of the first magnet system 1. The RF coil 9, being arranged within the magnet systems 1 and 3, encloses a measuring volume 29 which is large enough to enclose a patient to be examined or a part of a patient to be examined, for example the head and the neck, in an apparatus for carrying out medical diagnostic measurements. Thus, a magnetic field B, gradient fields for selecting object slices, and a spatially uniform RF alternating field can be generated in the measuring volume 29. The RF coil 9 is capable of combining the functions of transmitter coil and measuring coil, in which case a separating circuit 24 is provided so as to separate the forward and return signal traffic. Alternatively, different coils can be used for the two functions, for example a birdcage coil and/or a surface coil then acting as measuring coils. If desired, the coil 9 may be enclosed by an RF field shielding Faraday cage 31. The measuring coil in the device according to the invention consists of a combination of a first coil and a second coil.

Figure 2A:
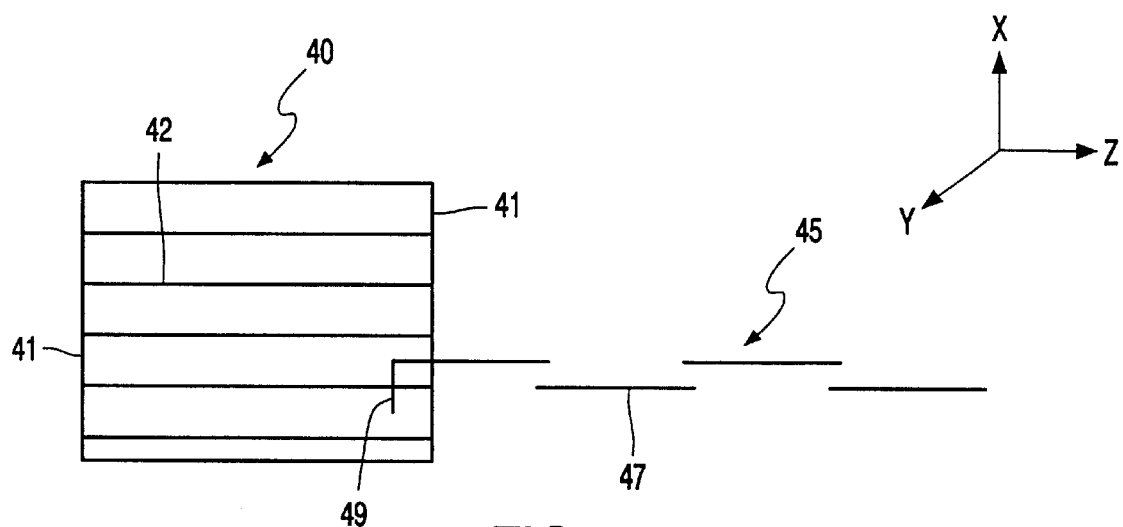
FIG. 2 is a diagrammatic sectional view of the combination of coils in the x-z plane.

FIG. 2a is a diagrammatic sectional view, taken in the x-z plane, of the combination of coils which includes a first coil in the form of a surface coil and a second coil in the form of a birdcage coil. The birdcage coil 40 includes two loop conductors 41 which are interconnected by means of longitudinal conductors 42 which, in the present embodiment, extend parallel to the z direction defined by the orthogonal system of co-ordinates. The surface coil 45 includes longitudinal conductors 47 which form part of turns which extend substantially parallel to the y-z plane; only the longitudinal conductors thereof are visible in FIG. 2. The first and the second coil are arranged one in the prolongation of the other and are oriented as a unit parallel to the z direction in space so that their individual areas of sensitivity overlap.

Figure 2B:
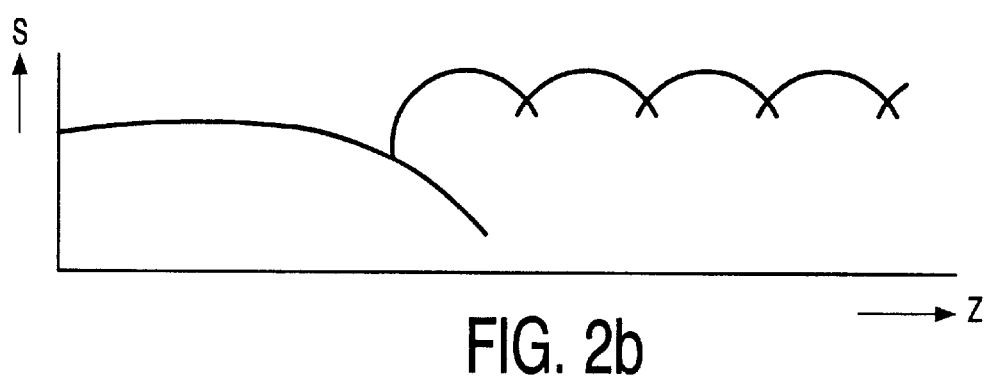
Figure 2C:
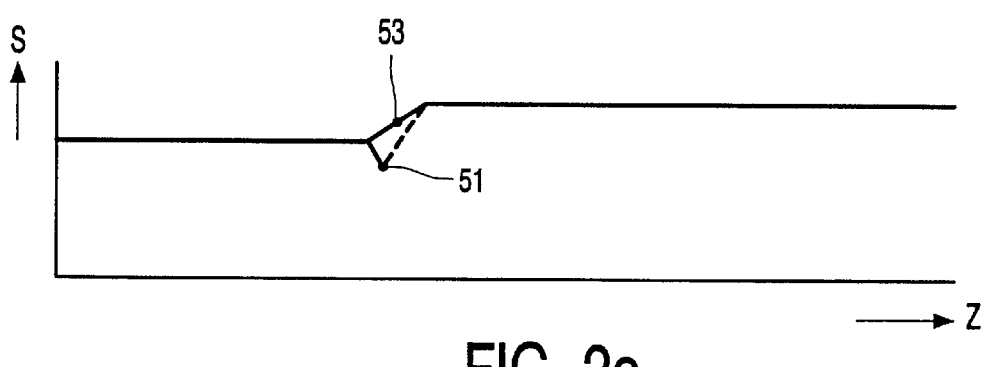

Generally speaking, each of the first and second coils is characterized by a respective signal-to-noise ratio. In the present example the signal-to-noise ratio of the surface coil 45 is higher than that of the birdcage coil 40. FIG. 2b shows the variation of the sensitivity s in the z direction. FIG. 2b reveals that a sensitivity disruption occurs in the transitional zone between the birdcage coil 40 and the surface coil 45. This sensitivity disruption causes artefacts in the MRI image and can be reduced by bending the end portion of the longitudinal conductor 47 of the surface coil 45 which faces the birdcage coil away from the y-z plane. This bent portion is denoted by the reference numeral 49 in FIG. 2a. FIG. 2c shows the associated improvement in respect of the sensitivity disruption in the transitional zone between two coils. The curve 51 in FIG. 2c represents the variation of the sensitivity if the step according to the invention is not taken, whereas the curve 53 represents the variation of the sensitivity when the step according to the invention is taken.

Figure 3A:
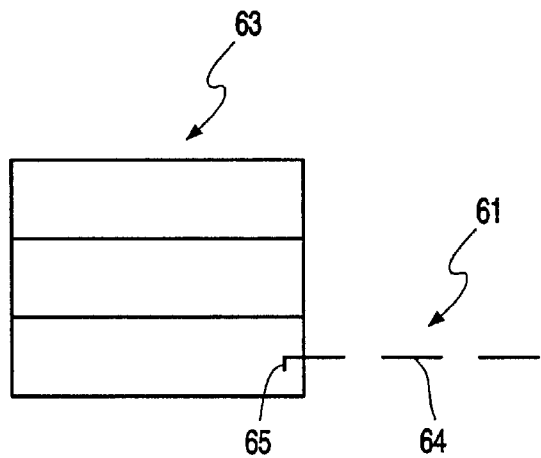
FIG. 3 shows examples of the assembly of the combination of coils.
Figure 3B:
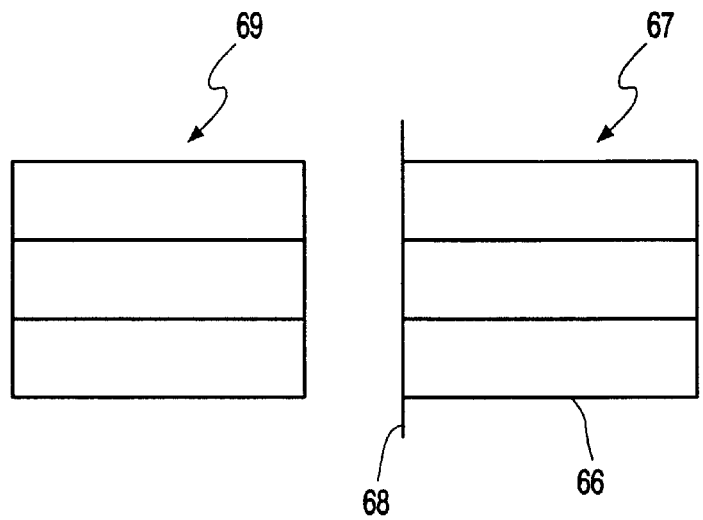
Figure 3C:
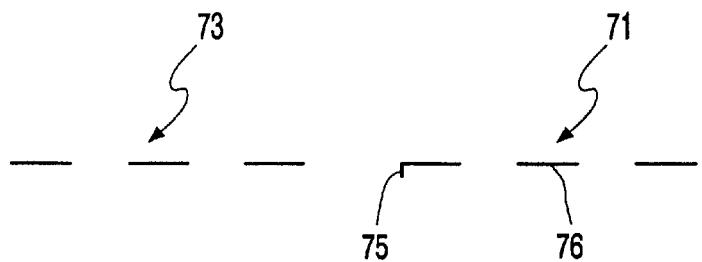
Figure 4A:
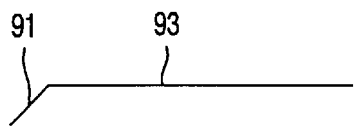
FIG. 4 shows diagrammatically feasible deformations of the end portion of a longitudinal conductor.
Figure 4B:
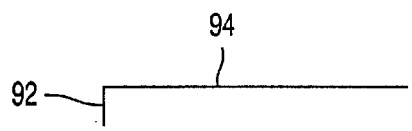
Figure 4C:
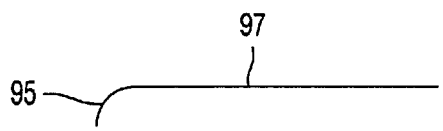
Figure 4D:
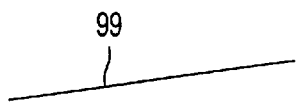

FIG. 3 shows feasible embodiments of the invention; FIG. 3a shows a combination of coils which is composed of one surface coil 61 and one birdcage coil 63, the signal-to-noise ratio of the surface coil being higher than that of the birdcage coil and the end portion 65 of the longitudinal conductor 64 of the surface coil 61 having been bent away from the y-z plane. FIG. 3b shows a combination of coils which is composed of a first birdcage coil 67 and a second birdcage coil 69, the signal-to-noise ratio of the first birdcage coil being higher than that of the second birdcage coil. The end portion 68 of the longitudinal conductor 66 of the first birdcage coil 67 has been bent away from the y-z plane. FIG. 3b shows the combination of coils consisting of a first surface coil 71 and a second surface coil 73. The signal-to-noise ratio of the first surface coil 71 is higher than that of the second surface coil 73 and the end portion 75 of the longitudinal conductor 76 of the first surface coil 71 has been bent away from the y-z plane.

FIG. 4 shows feasible shapes of the bent-away portion of the longitudinal conductor; FIG. 4a shows a sharp bend-like deformation of the end portion 91 of the longitudinal conductor 93; FIG. 4b shows an orthogonal deformation of the end portion 92 of the longitudinal conductor 94; FIG. 4c shows a gradual deformation of the end portion 95 of the longitudinal conductor 97, and FIG. 4d shows an embodiment in which the longitudinal conductor 99 as a whole is situated outside the y-z plane.

Figure 5A:
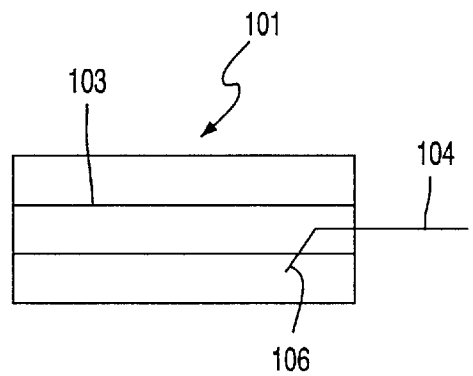
FIG. 5 shows diagrammatically a combination of coils with two or more bends in a longitudinal conductor.
Figure 5A:
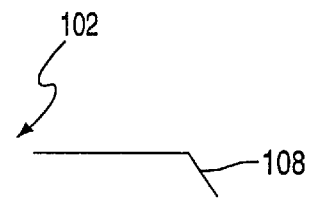
Figure 5B:
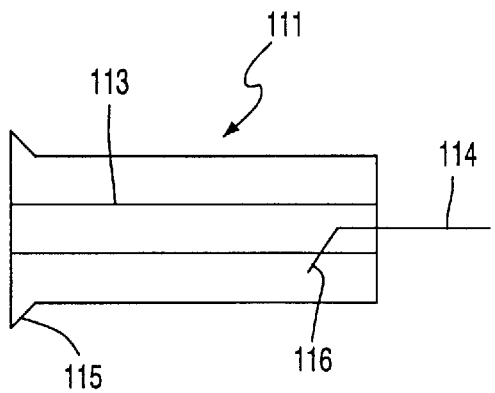
Figure 5B:
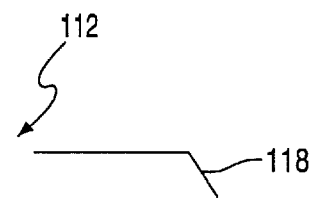

It is alternatively possible to form one or more bends in a longitudinal conductor. FIG. 5 shows a feasible combination of coils wherein an outwards facing end portion of the longitudinal conductor of a coil has been bent away from the y-z plane. FIG. 5a shows a combination of coils which consists of a birdcage coil 101 which is provided with longitudinal conductors 103 and a surface coil 102 which is provided with longitudinal conductors 104. The end portions 106 and 108 of the longitudinal conductors of the surface coil 102 have been bent away from the y-z plane. FIG. 5b shows a combination of coils which is composed of a birdcage coil 111 and a surface coil 112; the end portions 115 and 117 of the longitudinal conductor 113 of the birdcage coil have been bent away from the y-z plane and the end portions 116 and 118 of the longitudinal conductor 114 of the surface coil 112 have also been bent away from the y-z plane. In this context it is assumed that the surface coil has a signal-to-noise ratio which is higher than that of the birdcage coil.

What is claimed is:

1. A system comprising a magnetic resonance apparatus provided with a magnet system for producing a uniform magnetic field in a measuring volume, and a combination of coils for imaging an object to be examined which is to be positioned in the measuring volume, wherein an orthogonal system of co-ordinates (x, y, z) is chosen such that its z direction extends parallel to the direction of the magnetic field, wherein the combination of coils includes a first coil and a second coil for the detection of a radio frequency signal emitted by the object, said coils having a first and a second region of sensitivity, respectively, and a respective longitudinal conductor which extend parallel to a first plane (x-z) defined by the orthogonal system of co-ordinates such that their projections on a second plane (y-z) which is orthogonal to the first plane extend substantially parallel to the z direction, wherein the first and the second coil are oriented in space in such a manner that their longitudinal conductors are situated substantially one in the prolongation of the other and that the first area of sensitivity and the second area of sensitivity partly overlap, and wherein the first coil and the second coil have a first and a second signal-to-noise ratio, respectively, the first signal-to-noise ratio being higher than the second signal-to-noise ratio, and that at least one end portion of the longitudinal conductor of the first coil which faces the second coil is situated outside the y-z plane and extends in a direction away from the measuring volume.

2. A system as claimed in claim 1, wherein a main part of the longitudinal conductor of the first coil is situated in the y-z plane and a bend-like transition exists between its end portion which faces the second coil and the main portion.

3. A system as claimed in claim 1, wherein a main portion of the longitudinal conductor of the first coil is situated in the y-z plane and its end portion which faces the second coil exhibits a gradual transition from the y-z plane to a plane which encloses an angle larger than zero relative to the y-z plane.

4. A combination of coils as claimed in claim 1, wherein the longitudinal conductor of the first coil as a whole extends in a plane which encloses an angle larger than zero relative to the y-z plane.

5. A system as claimed in claim 1, wherein, furthermore, the end portion of the longitudinal conductor of the first coil which is remote from the second coil is situated outside the y-z plane.

6. A system as claimed in claim 5, wherein, furthermore, the end portion of the longitudinal conductor of the second coil which is remote from the first coil is situated outside the y-z plane.

7. A system as claimed in claim 2, wherein the end portion facing the second coil is bent orthogonally away from the y-z plane.

8. A system as claimed in the claim 5, wherein the end portion of the first coil which is remote from the second coil is bent orthogonally away from the y-z plane.

9. A system as claimed in claim 8, wherein the end portion of the second coil which is remote from the first coil is bent orthogonally away from the y-z plane.

10. An assembly as claimed in claim 2, wherein at least one of an end portion of the first coil and an end portion of_the second coil and/is arranged at least partly in a preformed fixture.

11. A combination of coils for use in assembly as claim 1.

* * * * *